United States Patent
Neidhardt et al.

(10) Patent No.: US 12,140,617 B2
(45) Date of Patent: Nov. 12, 2024

(54) ABSORBER DEVICE AND TEST SYSTEM

(71) Applicant: Rohde & Schwarz GmbH & Co. KG, Munich (DE)

(72) Inventors: Steffen Neidhardt, Munich (DE); Gerhard Hamberger, Munich (DE); Michael Freissl, Munich (DE); Maximilian Bogner, Munich (DE); Matthias Beer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 509 days.

(21) Appl. No.: 17/395,430

(22) Filed: Aug. 5, 2021

(65) Prior Publication Data
US 2023/0038708 A1    Feb. 9, 2023

(51) Int. Cl.
*G01R 29/08*    (2006.01)
*H04B 17/10*    (2015.01)
*H04B 17/12*    (2015.01)

(52) U.S. Cl.
CPC ....... *G01R 29/0821* (2013.01); *H04B 17/102* (2015.01); *H04B 17/104* (2015.01); *H04B 17/12* (2015.01)

(58) Field of Classification Search
CPC .... H04B 17/102; H04B 17/104; H04B 17/12; G01R 29/0821
See application file for complete search history.

(56) References Cited

U.S. PATENT DOCUMENTS

| | | | | |
|---|---|---|---|---|
| 3,308,463 A * | 3/1967 | Emerson | ................... | G01H 3/00 455/67.15 |
| 4,507,660 A * | 3/1985 | Hemming | ............. | G01R 29/105 342/1 |
| 5,631,661 A * | 5/1997 | Sanchez | ............. | G01R 29/0821 343/703 |
| 6,437,748 B1 * | 8/2002 | Burnside | ............... | G01R 29/105 343/703 |
| 8,013,775 B2 * | 9/2011 | Woods | ................. | H01Q 17/008 342/4 |
| 2006/0066467 A1 * | 3/2006 | Kurihara | ............... | H01Q 17/008 342/4 |
| 2006/0255998 A1 * | 11/2006 | Hirata | ................ | G01R 29/0878 342/4 |
| 2008/0024373 A1 * | 1/2008 | Khosravi | ............. | G01R 29/105 343/703 |
| 2013/0033279 A1 * | 2/2013 | Sozanski | ............ | G01R 29/0821 324/750.27 |
| 2013/0333976 A1 | 12/2013 | Aliev | | |
| 2015/0048962 A1 * | 2/2015 | Ho | ..................... | G01R 29/0821 324/750.22 |
| 2020/0081049 A1 * | 3/2020 | Lin | ..................... | H04B 17/391 |
| 2020/0081050 A1 | 3/2020 | Lin et al. | | |
| 2022/0057481 A1 * | 2/2022 | Aono | ........................ | G01S 7/40 |

FOREIGN PATENT DOCUMENTS

CN      204044363 U    12/2014

* cited by examiner

*Primary Examiner* — Marcus E Windrich
(74) *Attorney, Agent, or Firm* — CHRISTENSEN O'CONNOR JOHNSON KINDNESS PLLC

(57) ABSTRACT

An absorber device for absorbing signals is described. The absorber device has a housing with inner sides having an absorbing material. The housing is adaptable with regard to its geometry. The absorber device is portable. Moreover, a test system for testing radio frequency characteristics of a device under test is described.

16 Claims, 2 Drawing Sheets

ABSORBER DEVICE AND TEST SYSTEM

FIELD OF THE DISCLOSURE

Embodiments of the present disclosure relate to an absorber device for absorbing signals, such as electromagnetic signals and/or ultrasonic signals, particularly radar signals or Lidar (Light detection and ranging) signals. Further, embodiments of the present disclosure relate to a test system for testing over-the-air characteristics of a device under test.

BACKGROUND

In the state of the art, it is known to test certain devices with regard to their over-the-air characteristics and/or properties that may be associated with electromagnetic energy or rather ultrasonic energy. These devices are generally called devices under test, as their characteristics and/or properties are tested.

For testing purposes, test equipment is used that may emit a respective signal, for instance a radar signal, a Lidar signal and/or an ultrasonic signal, which is received by the device under test, thereby testing the receiving characteristics and/or properties of the device under test. Further, the test equipment may comprise at least one receiver for receiving a respective signal emitted by the device under test, thereby testing the transmitting characteristics and/or properties of the device under test. Hence, the respective device under test may be operated in a transmission mode or rather a receiving mode such that the test equipment comprises the corresponding counterpart device, namely a receiver or a transmitter.

Such testing is particularly known from automotive testing, wherein sensors of vehicles are tested concerning their characteristics, e.g. radar sensors associated with bumpers of the vehicles or rather Lidar sensors.

However, it has turned out that it is difficult to shield the test setup used for testing a vehicle in order to minimize external negative influences on the test setup, which might impair the test results obtained, for instance interfering signals. So far, the testing is performed in large anechoic halls that ensure a shielded environment for the entire vehicle.

However, these halls are rare and the costs related to such anechoic halls are high, e.g. their maintenance costs. In any case, the testing can only be performed at specific sites and specific dates which requires a lot of planning and further side effects, causing additional costs.

Accordingly, there is a need for an easy-to-handle and efficient way to provide a proper test environment for a device under test like a sensor of a vehicle.

SUMMARY

Embodiments of the present disclosure provide an absorber device for absorbing signals, for instance radio frequency signals, radar signals, ultrasonic signals and/or Lidar signals. In an embodiment, the absorber device has a housing with inner sides, which have an absorbing material. The housing is adaptable with regard to its geometry. In addition, the absorber device is portable.

Furthermore, embodiments of the present disclosure provide a test system for testing over-the-air characteristics of a device under test. In an embodiment, the test system comprises a device under test, a test and measurement instrument, and an absorber device for absorbing signals. The absorber device has a housing with inner sides having absorbing material. The housing is adaptable with regard to its geometry. The absorber device is portable.

Accordingly, the absorber device used for testing a device under test with regard to its over-the-air (OTA) characteristics and/or properties can be easily adapted to the respective device under test as the geometry of the housing of the absorber device can be adapted accordingly. Put differently, the absorber device may be adapted with regard to its size to the needs when testing a certain device under test, e.g., a sensor of a vehicle like a radar sensor, an ultrasonic sensor and/or a Lidar sensor, etc.

The absorber device generally ensures to provide a shielded environment for testing purposes of the device under test, for example a sensor of a vehicle, thereby reducing a potential interference with signals in the environment, for instance signals from neighboring test setups.

The inner surface of the housing may be covered by the absorbing material, thereby ensuring reflections from the housing itself while shielding the inner volume simultaneously.

Moreover, the absorber device can be fitted to the respective shape of the device under test due to the adaptable geometry of the housing such that an electromagnetically sealed connection between the device under test and the absorber device can be ensured.

Accordingly, a variable absorber device is provided that ensures to shield signals from the environment and to minimize internal reflections when testing the device under test. Thus, a clean radio frequency frontend with very low radar cross section is provided, wherein a noise floor as well as potential multipath reflections are effectively reduced.

In addition, the absorber device itself is portable, thereby ensuring that it can be easily connected to a certain device under test, for instance a vehicle having sensors to be tested. Typically, those sensors are integrated in a bumper of the vehicle, to which the absorber device can be directly attached. Hence, a small shielded chamber is created by the absorber device that is directly connected to the vehicle, which comprises the sensor to be tested.

Since the absorber device is portable and provides the shielded environment, namely the shielded chamber, the respective over-the-air tests for characterizing the device under test can be performed at any site. In some embodiments, rare anechoic halls are not necessary for performing the respective tests of the sensors of the vehicle.

In general, a space-saving, variable and lightweight absorber device is provided that ensures high shielding and absorbing characteristics, thereby minimizing any internal reflections.

In some embodiments, large devices under test like vehicles can be tested in an improved manner with regard to the over-the-air characteristics even though the same testing site is used for testing purposes, namely a testing site including a turntable on which the device under test, namely the vehicle, is located during testing.

As indicated above, the portable absorber device corresponds to a portable anechoic chamber that is established in an adaptable manner due to its adaptable housing geometry, thereby ensuring that the absorber device can be directly connected to several differently shapes devices under test, namely vehicles or rather portions of the same vehicle, for example close to a sensor to be tested.

Moreover, the adaptable housing ensures that the device under test, e.g., a sensor of the vehicle, is not impaired by the absorber device used for testing, for example with regard to a field of view (FOV) of the respective sensor, e.g., a field of view of a radar sensor or a Lidar sensor.

In addition, it is known that different types of devices under test have to be tested subsequently, for instance sensors with different fields of view. Thus, the adaptable size of the housing further ensures an easy re-configuration of the test setup, thereby ensuring that setting up the respective test setup is not time-consuming.

Generally, the test system may be used to simulate live or real conditions for testing the device under test. For instance, urban scenarios are simulated by providing a high object density.

The test and measurement instrument may encompass a radar target simulator having one or more circuits that are configured to simulate several completely independent targets.

The test and measurement instrument may be connected with a test equipment that is configured to generate an appropriate target scenario. The respective test equipment may correspond to a dynamic radar echo generator that interacts with the device under test, for example the radar sensor of the vehicle.

An aspect provides that the housing has a first interface side and a second interface side, wherein the interface sides are opposite to each other. The absorber device can be connected to the device under test via at least one of the two interface sides, for example the first interface side. The other interface side, e.g., the second interface side, may be associated with the test and measurement instrument. Accordingly, signals may be fed via the first interface side, which propagate along the absorber device, namely within the space limited by the housing, towards the second interface side at which these signals exit the absorber device. Obviously, the signals may also be fed via the second interface side, which propagate along the absorber device, namely within the space limited by the housing, towards the first interface side at which these signals exit the absorber device. Since the inner sides of the housing are covered by the absorbing material, internal reflections are minimized that may occur when passing the absorber device.

Another aspect provides that at least one of the first interface side or the second interface side is an open side. Accordingly, the device under test or rather the test and measurement instrument may be inserted or rather directly connected to the absorber device, thereby establishing a sealed connection between the absorber device and the device under test and/or between the absorber device and the test and measurement instrument.

Another aspect provides that at least one of the first interface side or the second interface side has a connection flange with mounting openings via which a connection member can be inserted to connect the absorber device via the connection flange. The connection flange may be established by a plate-like member that provides a respective interface surface for abutting on the component to which the absorber device is to be connected, e.g., the device under test. Respective connection members like screws or bolts may be inserted into the mounting openings, which are fixed to the other component, thereby firmly connecting the absorber device to the respective component, e.g., the device under test and/or the test and measurement instrument.

Moreover, the housing may provide a passage from the first interface side to the second interface side. The signals used for testing the device under test, e.g., ultrasonic signals, electromagnetic signals or any further signals, can propagate along the absorber device, namely along the passage defined between the interface sides. As indicated above, the passage is limited by the housing in a circumferential manner, wherein the limiting sides of the housing are covered by the absorbing material that at least reduces internal reflections of the signals propagating along the passage.

Another aspect provides that the housing widens from the first interface side towards the second interface side. This ensures that a field of view (FOV) of a sensor to be tested, e.g., a sensor of the vehicle, is not limited by the absorber device due to the shape of the housing, namely the widening geometry of the housing.

Since the geometry of the housing is adaptable, the level of widening can be adapted in order to meet the respective field of view of the device under test, namely the respective sensor.

In other words, the ratio of the first interface side to the second interface side defines the level of widening. Since the level of widening can be adapted, the respective ratio is adaptable.

The first interface side may be used for being assigned to a device under test, whereas the second interface side is used for accommodating a test and measurement instrument at least partly. Therefore, the device under test and the test and measurement instrument may interact with each other along the passage provided by the absorber device, wherein the components for testing, namely the device under test and the test and measurement instrument, are associated with the opposite interface sides such that they face each other.

The passage is shielded by the housing. The absorbing material that is located at the inner sides limiting the passage reduces any internal reflections when the signals propagate along the passage.

Generally, an easy-to-handle absorber device is provided as the absorber device can be connected to the device under test easily and, further, the test and measurement instrument can be inserted into the absorber device at least partly, namely via the second interface.

In other words, the test and measurement instrument can be introduced into the absorber device at least partly, which may provide a press fit for the test and measurement instrument. Alternatively or additionally, the test and measurement instrument may be firmly connected with the absorber device via its second interface, which may provide a second connection flange at which the test and measurement instrument can be connected.

In addition, the second interface side may be configured to accommodate more than one test and measurement instrument at least partly. Thus, the device under test, for example a sensor like a radar sensor, can be tested in a detailed manner since several test and measurement instruments interact with the device under test simultaneously.

The entire field of view of the respective device under test, for example a sensor, can be investigated simultaneously by using several test and measurement instruments that are associated with only a certain portion of the entire field of view. For instance, the entire field of view of the device under test, for example its sensor, may encompass an angular range of 210°, wherein three different test and measurement instruments are provided, each being associated with an angular range of 70°.

In any case, several independent angular directions can be investigated simultaneously, wherein the number of independent angular directions to be investigated simultaneously depends on the number of test and measurement instruments installed at the second interface side. For instance, up to four test and measurement instruments are installed, resulting in up to four independent angular directions that can be investigated simultaneously. In some embodiments, up to eight test and measurement instruments are installed, resulting in up to eight independent angular directions that can be investigated simultaneously.

The absorbing material may be a lightweight material, which however provides mechanical robustness. Thus, the absorber device can be transported easily due to its weight. In addition, the required mechanical robustness of the absorbing material, also called mechanical sturdiness, is ensured.

For instance, the absorbing material is made of a foam material. The foam material ensures signal-absorbing characteristics while being lightweight and also providing the required mechanical robustness. In some embodiments, the foam material is resilient such that it can be compressed.

Generally, the absorbing material may be shaped such that signals are absorbed, for instance electromagnetic waves and/or ultrasonic waves. Thus, the absorbing material absorbs the respective signals due to its shape, which provides attenuation and, thus, absorbing characteristics, thereby reducing any internal reflections.

For instance, the absorbing material comprises several pyramids, for example pyramids of a foam, which extend from a base, e.g., made of the same material.

Any signals impinging on the respectively shaped absorbing material, namely the pyramids, are reflected between neighbored pyramids, thereby getting attenuated accordingly.

According to another aspect, the housing has at least two parts that are configured to be moved relative with respect to each other, thereby adapting the geometry of the housing. Hence, mechanical stiff parts, which provide parts of the housing, are connected with each other such that they can be moved with respect to each other in order to adapt the geometry of the housing. Therefore, the size of the housing, for example the size of the respective interface side(s) and/or the passage, is adapted.

For instance, the housing has a main part and two side parts, wherein the two side parts are symmetrically identical, and wherein both side parts are arranged in mirror symmetry with respect to the main part. The side parts relate to lateral portions of the entire housing that can be shifted with respect to each other, for example with respect to the main part, thereby widening the housing and thus adapting the geometry of the housing.

The two side parts may be detachably connected with the main part such that the absorber device is configured to enable a relative movement of both side parts with respect to the main part, thereby adapting the geometry of the housing. The side parts can be attached to the main part, for instance by screws and/or bolts, in order to define a mechanical stiff configuration of the absorber device. In case of adapting the geometry of the housing, the respective connection(s) established are/is detached in order to move the side parts with respect to the main part. Once the desired or intended shape/geometry of the housing is obtained, the side parts may be attached to the main part (again), thereby defining the adapted geometry of the housing of the absorber device.

The housing may have a first interface side and a second interface side, wherein the interface sides are opposite to each other. The main part has at least two opposite sides that widen from the first interface side towards the second interface side. The respective sides of the main part are perpendicular to the lateral sides of the housing which are defined by the side parts. Therefore, the absorber material always has a widening geometry, wherein the effect can be increased by moving the side parts with respect to the main part.

Generally, the absorber device may be established in a modular manner, which means that certain parts of the housing can be exchanged, thereby enabling a modular arrangement of the housing and the overall absorber device.

The absorber device may be configured such that the main part is exchangeable, thereby modularly adapting the size of the absorber device, namely the housing. In other words, the main part having a certain widening effect may be replaced by another main part having a different widening effect. Thus, the cone-shape or rather funnel-shape of the absorber device can be adapted while using another main part to which the side parts are connected. The respective main part selected for the housing may depend on the device under test and/or the number of test and measurement instruments.

Generally, the signals may be assigned to electromagnetic energy or ultrasonic energy.

The housing may have a first interface side and a second interface side, which are opposite to each other, and wherein the device under test is associated with the first interface side, whereas the test and measurement instrument is at least partly accommodated by the second interface side. Thus, an electromagnetically sealed environment can be established, as the test and measurement instrument is at least partly inserted into the absorber device via the second interface side, which is open, thereby ensuring that the test and measurement instrument can be inserted into the absorber device.

Furthermore, the device under test may be a sensor of a vehicle, wherein the absorber device is connected with the vehicle. Accordingly, the test system may be used for testing a vehicle, for example the respective sensors of the vehicle such as radar sensors, ultrasonic sensors and/or Lidar sensors.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
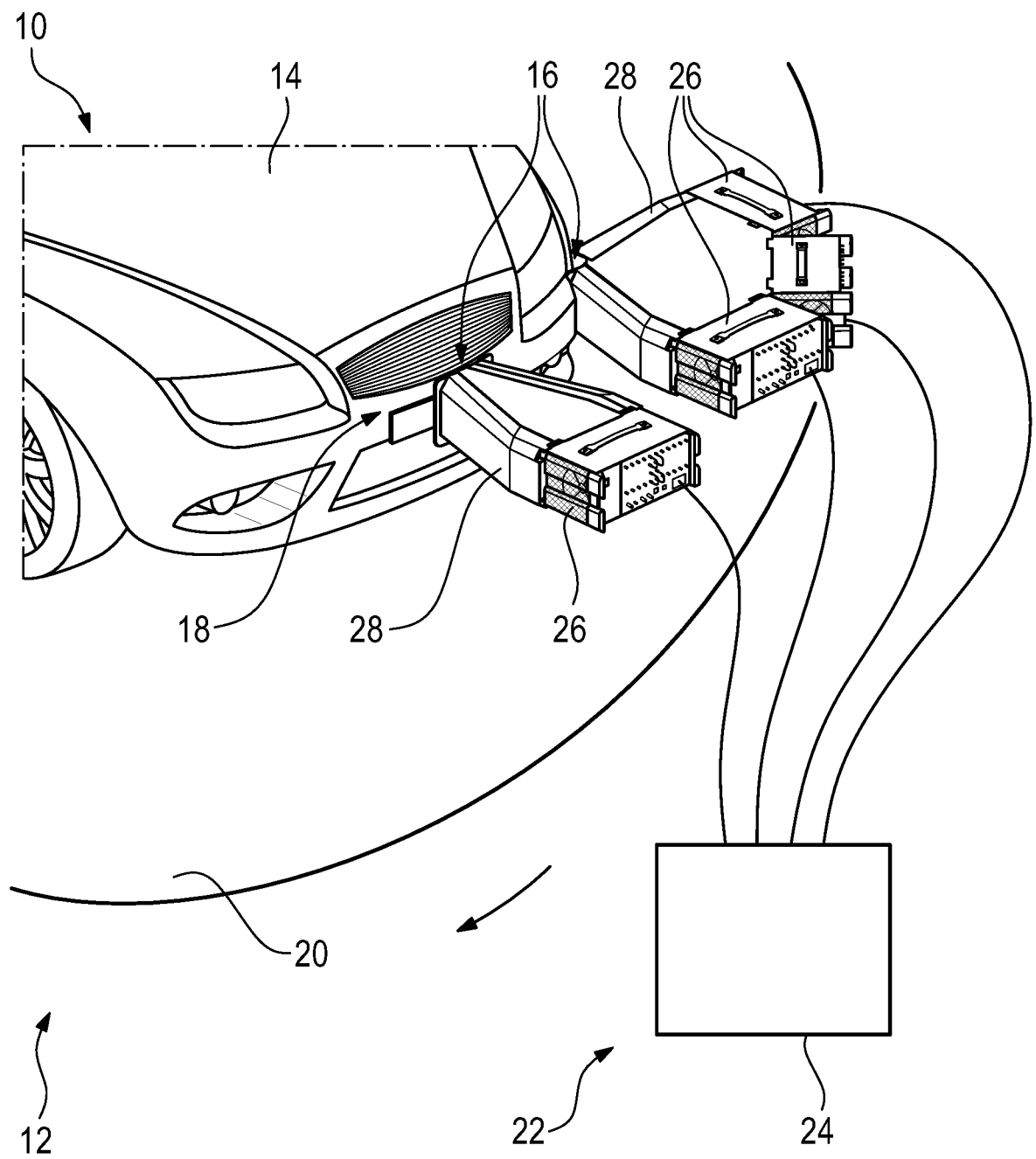
FIG. 1 schematically shows an overview of a representative test system.

Turning now to FIG. 1, a test system 10 is shown that comprises a test setup 12 for testing a device under test 14. In the shown embodiment, a vehicle with several sensors 16 is provided, which are located in a bumper region 18 of the vehicle. These sensors 16 correspond to the device under test, as their characteristics and/or properties are tested accordingly. The respective sensors 16 may relate to radar sensors, Lidar sensors and/or ultrasonic sensors that are used for sensing an environment of the vehicle when driving the vehicle, for example during a parking maneuver.

The test system 10, for example the test setup 12, comprises a turntable 20 (partly shown in FIG. 1) on which the vehicle, and therefore the sensors 16 or the device(s) under test 14, is located such that the vehicle can be turned in a plane defined by the turntable 20 during testing.

The test system 10, for example the test setup 12, further comprises a test equipment 22 with an analyzing device 24 that is connected with several test and measurement instruments 26. The analyzing device 24 includes, for example, one or more analyzing circuits.

In the shown embodiment, four test and measurement instruments 26 are provided, which are associated with the device under test 14, namely the sensors 16.

The test system 10 may further comprise two different absorber devices 28 that are associated with the device under test 14, namely the sensors 16, and the test and measurement instruments 26. As shown in FIG. 1, the test and measurement instruments 26 are partly inserted into the absorber devices 28 which will be explained hereinafter in more detail when referring to FIGS. 2 and 3.

Figure 2:
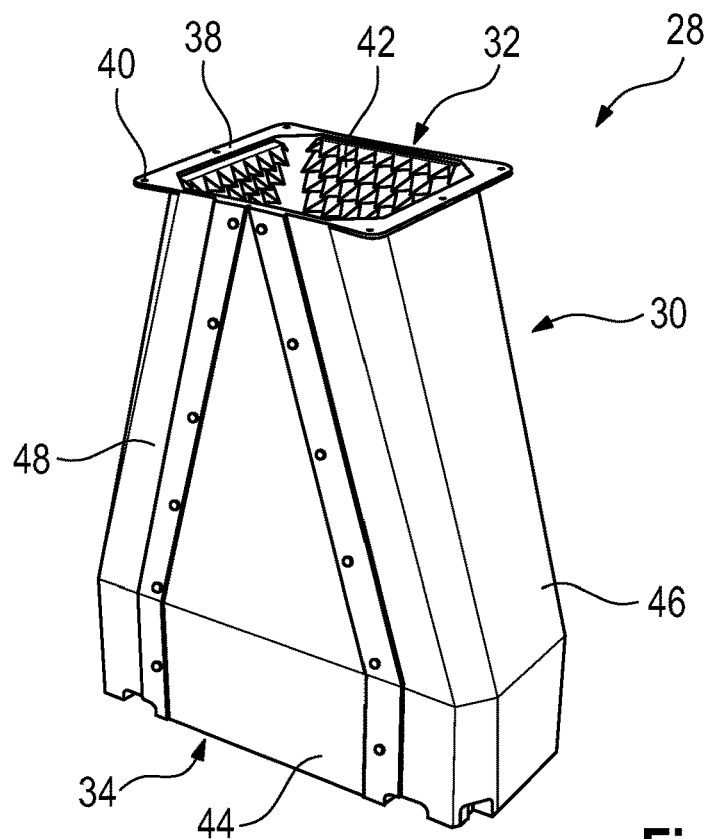
FIG. 2 schematically shows an overview of an absorber device according to an embodiment of the present disclosure.
Figure 3:
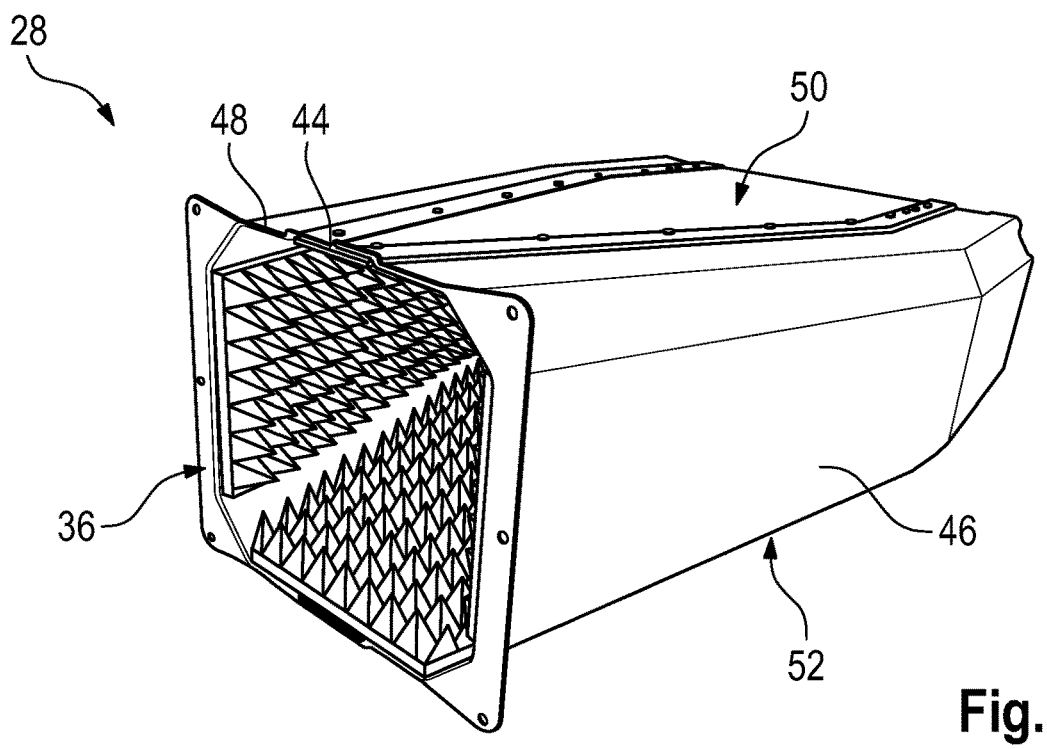
FIG. 3 shows another schematic view of an absorber device according to an embodiment of the present disclosure.

In FIGS. 2 and 3, the respective absorber device 28 is shown in more detail to which reference is made hereinafter. The absorber device 28 is generally configured for absorbing signals such as electromagnetic signals and/or ultrasonic signals, which may impair the testing of the device under test 14, for example the sensors 16.

Generally, the absorber device 28 is used for shielding purposes such that the device under test 14 and the test and measurement instruments 26 can interact with each other without any interfering signals from the environment, for instance signals from other measurement equipment. In some embodiments, the absorber device 28 is generally funnel-like shaped, as the absorber device 28 has a housing 30 with a first interface side 32 and a second interface side 34 which are opposite to each other.

The respective interface sides 32, 34 are open, whereas the housing 30 provides a passage 36 from the first interface side 32 to the second interface side 34 that follows the shape of the hosing 30, namely the funnel-shape or rather cone shape. In other words, the respective passage 36 widens from the first interface side 32 towards the second interface side 34, thereby establishing the funnel shape of the entire housing 30 of the absorbing device 28.

Furthermore, it is shown that the first interface side 32 has a connection flange 38 established by a plate-like member having mounting openings 40 through which respective connection members, for instance bolds or screws, can be inserted in order to connect the absorber device 28 to the vehicle or rather the device under test 14. This is also schematically shown in FIG. 1, as the absorber device 28 is connected with a portion of the vehicle, namely at a portion of the bumper region 18 to which the number plate is connected.

Accordingly, the first interface side 32 is used for being assigned to the device under test 14, whereas the second interface side 34 is used for partially accommodating at least one test and measurement instrument 26 as shown in FIG. 1.

In general, the absorber device 28 comprises an absorbing material 42 that is located at inner sides of the housing 30, wherein the absorbing material 42 covers the inner surface of the housing 30. The absorbing material 42 is a lightweight material that provides a certain mechanical robustness. For instance, the absorbing material 42 is made by a foam material.

The absorbing material 42 is shaped such that signals impinging on the absorbing material 42 are absorbed effectively. As shown in FIGS. 2 and 3, the absorbing material 42 comprises several pyramids that are used to absorb the signals due to the respective shape. Signals impinging on the pyramids get reflected between neighbored pyramids such that they are attenuated due to multiple reflection, resulting in an absorbance of the respective energy associated with the signals.

Hence, it is ensured that internal reflections along the passage 36 defined by the housing 30 are minimized, thereby reducing any influence of those internal reflections.

In general, the housing 30 of the absorber device 28 is adaptable with regard to its geometry, as the housing 30 is made of at least two different parts that can be moved with respect to each other in order to adapt the geometry of the housing 30. In the shown embodiment in FIGS. 2 and 3, the housing 30 is made of a main part 44 and two side parts 46, 48 that define lateral sides of the housing 30. The respective side parts 46, 48 may be symmetrically identical, wherein the side parts 46, 48 are arranged in mirror symmetry with respect to the main part 44.

As shown in FIGS. 2 and 3, the main part 44 has at least two opposite sides 50, 52 that extend from the first interface side 32 towards the second interface side 34 wherein these opposite sides 50, 52 widen from first interface side 32 towards the second interface side 34, thereby already defining the funnel-shape of the housing 30. Put differently, the main part 44 already defines the funnel-like shape of the absorber device 28. The opposite sides 50, 52 are generally perpendicular to the side parts 46, 48 that define the lateral sides of the housing 30 as shown in FIGS. 2 and 3.

In addition, the side parts 46, 48 are detachably connected with the main part 44 such that their relative orientation with respect to each other and with respect to the main part 44 can be adapted in order to adjust the shape of the absorber device 28, for example the housing 30.

For this purpose, the side parts 46, 48 can be disconnected from the main part 44. Then, the side parts 46, 48 may be moved with respect to the main part 44, thereby narrowing or widening the geometry of the housing 30, namely adapting the widening effect of the housing 30 accordingly. Once the intended geometry has been obtained, the side parts 46, 48 are connected with the main part 44 (again) such that a mechanically stable absorber device 28 is obtained.

Moreover, the main part 44 of the absorber device 28 can be exchanged in order to redefine the respective geometry of the absorber device 28 in an extreme manner Hence, the entire absorber device 28, for example its housing 30, is established in a modular manner.

In FIG. 1, two different kinds of absorber devices 28 are shown that have different main parts 44, but the same side parts 46, 48 that are connected to lateral sides of the different main parts 44. Accordingly, each of the absorber devices 28 shown in FIG. 1 can be adapted such that it corresponds to the other one by simply exchanging the main part 44 and (re-)positioning the respective side parts 46, 48 accordingly.

Due to the exchangeable main parts 44, the absorber devices 28 are generally established in a modular manner, as the respective main part 44 can be exchanged in order to adapt the geometry of the absorber device 28, for example the housing 30.

As already indicated above, the respective lateral sides of the main parts 44 are open and perpendicular to the opposite sides 50, 52 of the main parts 44 that widen from the first interface side 32 to the second interface side 34. Thus, the housing 30 is limited at its lateral sides by the side parts 46, 48.

In general, the shape of the housing 30, namely the funnel-like shape of the housing 30, is adapted to a field of view (FOV) of the respective sensor(s) 16 to which the absorber device 28 is assigned such that the field of view is not limited by the absorber device 28.

Nevertheless, the absorber device 28 ensures that an internal space of the absorber device 28, which is defined by the passage 36, is shielded with respect to the environment in an efficient manner, thereby reducing any noise and other disturbing effects from the environment when testing the respective sensors 16 by the test and measurement instruments 26 inserted into the absorber devices 28 via the respective second interface sides 34.

In addition, the absorbing material 42 at the inner sides of the housing 30 minimize internal reflections of the signals propagating along the passage 36.

Generally, the absorber devices 28 are portable due to their limited size such that they can be easily attached to a different device under test 14 at respective premises of the customers. Therefore, an easy-to-handle as well cost-efficient absorber device 28 is provided that ensures high absorbing characteristics such that reliable measurements can be performed.

Since the absorber device 28 provides a shielding effect with regard to the environment, the absorber device 28 is a shielding and absorber device, as disturbing signals from the environment are shielded and internal reflections are absorbed.

Generally, the test equipment 22 may encompass a radar target simulator that is configured to simulate several completely independent targets. The test and measurement instruments 26 may be connected with the respective test equipment 22 that is configured to generate an appropriate target scenario, e.g., a dynamic radar echo generator that interacts with the device under test 14, for example the radar sensor(s) 16 of the vehicle.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An absorber device for absorbing signals, wherein the absorber device has a housing with inner sides having an absorbing material, wherein the housing is adaptable with regard to its geometry, wherein the absorber device is portable, wherein the housing has a first interface side and a second interface side, wherein the interface sides are opposite to each other, wherein each of the first interface side and the second interface side is an open side, and wherein the housing has at least two parts that are configured to be moved relatively with respect to each other, thereby adapting the geometry of the housing.

2. The absorber device according to claim 1, wherein at least one of the first interface side and the second interface side has a connection flange with mounting openings via which a connection member can be inserted to connect the absorber device via the connection flange.

3. The absorber device according to claim 1, wherein the housing provides a passage from the first interface side to the second interface side.

4. The absorber device according to claim 1, wherein the housing widens from the first interface side towards the second interface side.

5. The absorber device according to claim 1, wherein the first interface side is used for being assigned to a device under test, and wherein the second interface side is used for accommodating a test and measurement instrument at least partly.

6. The absorber device according to claim 1, wherein the second interface side is configured to accommodate more than one test and measurement instrument at least partly.

7. The absorber device according to claim 1, wherein the absorbing material is made of a foam material.

8. The absorber device according to claim 1, wherein the absorbing material is shaped such that signals are absorbed.

9. The absorber device according to claim 1, wherein the housing has a main part and two side parts, wherein the two side parts are symmetrically identical, and wherein both side parts are arranged in mirror symmetry with respect to the main part.

10. The absorber device according to claim 9, wherein the two side parts are detachably connected with the main part such that the absorber device is configured to enable a relative movement of both side parts with respect to the main part, thereby adapting the geometry of the housing.

11. The absorber device according to claim 9, wherein the housing has a first interface side and a second interface side, wherein the interface sides are opposite to each other, and wherein the main part has at least two opposite sides that widen from the first interface side towards the second interface side.

12. The absorber device according to claim 1, wherein the absorber device is established in a modular manner.

13. The absorber device according to claim 9, wherein the absorber device is configured such that the main part is exchangeable, thereby modularly adapting the size of the absorber device.

14. A test system for testing over-the-air characteristics of a device under test, wherein the test system comprises:
a device under test;
a test and measurement instrument; and
an absorber device for absorbing signals,
wherein the absorber device has a housing with inner sides having an absorbing material, wherein the housing is adaptable with regard to its geometry, wherein the absorber device is portable, wherein the housing has a first interface side and a second interface side, wherein the interface sides are opposite to each other, wherein each of the first interface side and the second interface side is an open side, and wherein the housing has at least two parts that are configured to be moved relatively with respect to each other, thereby adapting the geometry of the housing.

15. The test system according to claim 14, wherein the device under test is associated with the first interface side, whereas the test and measurement instrument is at least partly accommodated by the second interface side.

16. The test system according to claim 14, wherein the device under test is a sensor of a vehicle, and wherein the absorber device is connected with the vehicle.

* * * * *